United States Patent
Yamaguchi et al.

(10) Patent No.: US 11,605,549 B2
(45) Date of Patent: Mar. 14, 2023

(54) AIR CONDITIONER, UNIT FOR FLOATING CONVEYING SUBSTRATE WITH AIR CONDITIONER, AND METHOD OF SUPPLYING AIR FOR FLOATING CONVEYING SUBSTRATE

(71) Applicant: SHINWA CONTROLS CO., LTD, Kawasaki (JP)

(72) Inventors: Shunji Yamaguchi, Kawasaki (JP); Takuya Ishimatsu, Kawasaki (JP); Humiyuki Hosoi, Kawasaki (JP)

(73) Assignee: Shinwa Controls Co., Ltd., Kawasaki (JP)

( * ) Notice: Subject to any disclaimer, the term of this patent is extended or adjusted under 35 U.S.C. 154(b) by 196 days.

(21) Appl. No.: 16/582,398

(22) Filed: Sep. 25, 2019

(65) Prior Publication Data
US 2020/0126834 A1  Apr. 23, 2020

(30) Foreign Application Priority Data

Oct. 19, 2018  (JP) .............................. JP2018-197489

(51) Int. Cl.
*H01L 21/677* (2006.01)
*B65G 69/20* (2006.01)
*F25B 13/00* (2006.01)

(52) U.S. Cl.
CPC ........ *H01L 21/67784* (2013.01); *B65G 69/20* (2013.01); *F25B 13/00* (2013.01)

(58) Field of Classification Search
CPC ....... B65G 69/20; B65G 51/035; F24F 11/63; F24F 2110/10; F25B 13/00; F25B 49/02;
(Continued)

(56) References Cited

U.S. PATENT DOCUMENTS

| | | | | |
|---|---|---|---|---|
| 3,738,117 A | * | 6/1973 | Engel | F24F 3/153 62/173 |
| 2008/0117551 A1 | * | 5/2008 | Brackley | H01L 21/6838 360/235.4 |
| 2018/0238580 A1 | * | 8/2018 | Ikeda | F24F 11/72 |

FOREIGN PATENT DOCUMENTS

| | | | |
|---|---|---|---|
| JP | H1163689 A | * | 3/1995 |
| JP | 2006264804 A | * | 10/2006 |

(Continued)

OTHER PUBLICATIONS

Ham, Baking Apparatus, May 27, 2010, KR20100055818A, Whole Document (Year: 2010).*

(Continued)

*Primary Examiner* — Larry L Furdge
(74) *Attorney, Agent, or Firm* — Burr Patent Law, PLLC

(57) ABSTRACT

An air conditioner includes a blower unit to blow air at a predetermined amount, a cooling unit arranged downstream of the blower unit in an air flowing direction, a compressor which is operated at a variable operating frequency so that a revolving speed thereof is adjustable, a condenser, and a cooling coil connected in this order by pipes to circulate a heating medium to cool blown air with a heating unit arranged on a downstream side of the cooling unit in the air flowing direction in which the blown air is heated by a heater, and a control unit controls the operating frequency of the compressor and includes a compressor control part which adjusts the revolving speed of the compressor such that the operating frequency of the compressor is decreased by a predetermined frequency when an output of the heating unit exceeds a first threshold value.

17 Claims, 6 Drawing Sheets

(58) Field of Classification Search
CPC ...... F25B 2400/0403; F25B 2600/2501; F25B 6/04; F25B 2600/021; F25B 2700/1933; F25B 2700/21161; F25B 41/40; F25B 41/31; F25B 49/022; Y02B 30/70; H01L 21/67109; H01L 21/67017; H01L 21/67098; H01L 21/67248; H01L 21/67784

See application file for complete search history.

(56) References Cited

FOREIGN PATENT DOCUMENTS

| | | | |
|---|---|---|---|
| JP | 2008147293 A | * | 6/2008 |
| JP | 2010-067896 A1 | | 3/2010 |
| JP | 6049936 B1 | | 12/2016 |
| KR | 20100055818 A | * | 5/2010 |

OTHER PUBLICATIONS

Nishihara et al., Refrigerating Facility and Method for Controlling Heating Thereof, Mar. 5, 1995, JPH1163689A, Whole Document (Year: 1995).*

Shinohara, Flotation Unit for Large Flat Panel . . . , Oct. 5, 2006, JP2006264804A, Whole Document (Year: 2006).*

Kasahara, Substrate Supporting Apparatus . . . , Jun. 26, 2008, JP2008147293A, Whole Document (Year: 2008).*

* cited by examiner

AIR CONDITIONER, UNIT FOR FLOATING CONVEYING SUBSTRATE WITH AIR CONDITIONER, AND METHOD OF SUPPLYING AIR FOR FLOATING CONVEYING SUBSTRATE

BACKGROUND OF THE INVENTION

1. Field of the Invention

The present invention relates to an air conditioner, an unit for floating conveying substrates with such an air conditioner, and a method of supplying air used for conveying substrates in a floating manner, in particular, relates to the air conditioner which is capable of supplying air with a predetermined air amount a temperature of which is strictly adjusted, the unit for floating conveying substrates with such an air conditioner, and the method of supplying air for conveying substrates in a floating manner which are capable of maintaining a temperature around substrates required in accordance with the process of substrates to be constant, while at the same time, capable of strictly adjusting the temperature required for processing substrates free of control, irrespective of the temperature variations around substrates being caused due to the floating conveyance of substrates.

2. Description of Related Art

Conventionally, air conditioners have been widely used for domestic applications, or in an industry for manufacturing various kinds of electronic precise devices such as semiconductors, a food industry, and a printing industry, etc.

An indoor temperature of a clean room in a semiconductor manufacturing plant is strictly managed by an air conditioner. For example, the indoor temperature of the clean room, in which an apparatus (such as a coater) for coating and developing a photoresist is installed, is sometimes required to be controlled within an error range of between +0.05° C. and −0.05° C. relative to a target temperature.

In recent years, a resist coating and developing system has been used in photolithography for manufacturing flat panel displays (FPD). In order to safely and efficiently cope with an increase in size of a substrate to be processed (e.g., a glass substrate), a method has been introduced in which a predetermined amount of liquid, gas, light, heat, or the like is applied to a surface to be processed of a substrate while moving the substrate on a substrate transport line set in one horizontal direction, and a predetermined process is performed in various processing steps.

In this type of the air conditioning apparatus, generally, a use temperature range and a temperature control range are defined, and if a temperature of the taken-in air is within the use temperature range, the air is controlled to a desired set temperature within the temperature control range and supplied at a predetermined air amount. However, in recent years, there has been reported many problems in that significant fluctuations in environmental temperature due to generation of high and low temperature waves and the like occur frequently in many areas, and thus, the control of the air conditioner becomes unstable.

A technology for overcoming the unstable controllability of the air conditioner caused by such fluctuations in environmental temperature is disclosed in the Patent Publication 1, for instance.

In the above air conditioner, an air flow passage has an intake port for taking in external air and a discharge port for discharging the air taken in from the intake port, a blower for allowing air to flow from the intake port toward the discharge port, and a cooling part which is housed in the air flow passage and has a variable refrigerating capacity. A heating unit which is housed in the air flow passage and heats the air taken in from the intake port, and a return flow passage which extends from a position downstream of the cooling unit and downstream of the heating unit to a position upstream of the cooling unit. In the air conditioner, air supplied to a position upstream of the cooling unit via the return channel and upstream of the heating unit may be merged with outside air or outside air after being taken into the intake unit.

A portion of air that has passed through the cooling part and the heating part is supplied to a position upstream of the cooling part and an upstream side of the heating part by the return flow passage, and can be combined with air or air after being taken into the intake port and taken into the intake port of the air flow passage. Thus, even if the temperature of the external air taken into the intake port varies greatly in response to a significant change in the ambient temperature, this external air merges with the air from the temperature controlled return flow passage, so that the temperature approaches the temperature at which the temperature is to be controlled. Therefore, even if the refrigeration capacity or the heating capacity is not rapidly changed in accordance with a large variation in the temperature of the external air, it is easy to control the outside air that has merged with the air from the return flow passage to a desired temperature. Therefore, even when the ambient temperature is significantly changed, it is possible to control the air to be temperature-controlled to a desired temperature in a stable state.

According to the above air conditioner, although the influence on the environmental fluctuation (an ambient temperature variation) can be alleviated, following technical problems arise.

Firstly, the air amount is sacrificed in order to supply air with a predetermined temperature.

More specifically, by adjusting an opening of a damper for adjusting the air amount, a rate of an air amount supplied to an upstream side of the cooling and heating units to that blown by the blower is fluctuated, so that the air amount supplied to the use area such as a clean room is fluctuated. Accordingly, the above air conditioner is effective only for an application in which the air temperature is allowed to use as a controlling means under the condition that the air temperature and/or the air humidity is prioritized.

Secondly, in the control unit, the control of the cooling part and the control of the heating part are independent from each other, or, in order to attain the stability of the control, the compressor in the cooling part is merely operated under a constant frequency, so that more flexible control of the air temperature by the cooperation between the control of the cooling part and the control of the heating part cannot be accomplished. Such being the case, even though the influence on the environmental fluctuation (an ambient temperature variation) can be alleviated, it is technically difficult to control the air temperature in an accurate manner so as to conform it to the target air temperature, in particular, to flexibly control the air temperature without sacrificing the air amount.

In this connection, a unit for floating conveying substrates has been conventionally used in order to convey substrates such as FPD. The unit for floating conveying substrates causes the substrate to convey by floating substrates by jetting air from below toward substrates, while at the same time, by applying a thrust to substrates. Such a unit for floating conveying substrates is disclosed in the Patent Publication 2, for instance.

More specifically, a plurality of floating units upper surfaces of which are arranged to be flush with each other, and a suction block disposed between the floating units are provided. On each of the upper surfaces of the floating units, a plurality of air injection holes and air supplying holes are provided. An air supply source is connected to the air supplying holes, so that air with a predetermined pressure is supplied through each of the air supplying holes.

The air supply source supplies air with a predetermined pressure through each of the air supplying holes, so that air is blown upwardly from each of air injection holes to float the glass substrates.

On the other hand, a negative pressure air supply source discharges air through each of the air suction holes, so that a negative pressure is created by the suction of air to suck the glass substrates.

When the glass substrate is conveyed, the substrate is caused to float on each of the floating units by an air layer being formed between the substrate and the upper surface of each of the floating units by means of air pressure blown upwardly from each of the air injection holes, while at the same time, the substrate is caused to be drawn by a negative pressure of air sucked through the air suction holes. A warp of the substrate can be corrected by a positive pressure of air blown upwardly from each of the air injection holes and a negative pressure causing the suction of the substrates being balanced.

However, since the substrates pass over the air injection holes while they are conveyed, a pressure of air jetted from the air injection holes can be varied, so that the temperature around the substrates can be varied due to the variation of such an air pressure.

More specifically, when the substrate passes through one floating unit, the substrate gradually covers a plurality of air injection holes on the upper surface of the floating unit, so that the air pressure increases. The increase of air pressure is maximized when the number of the air injection holes which the substrate covers is maximized, and the pressure decreases after it reaches the maximum point. Such being the case, the temporary variation of the air pressure can be caused while one substrate passes a single floating unit.

However, in a clean room where a coating and development apparatus (a coater, for instance) is provided, it is sometimes required for a temperature in the clean room to be controlled within an error range of between +0.05° C. and −0.05° C. relative to a target temperature, for instance, so that it can be that such a temporary variation of air temperature due to the above pressure variation is not permitted.

In this case, as described above, if the temperature of air is adjusted by adjusting the air amount under the condition that the air temperature management takes precedence, it becomes technically difficult to use the air conditioner for an application of floating conveying substrates, since the air amount is inevitably varied.

With respect to applications for the air conditioner, one in which air with an air amount within a predetermined range is supplied under the condition that the air temperature takes precedence, one in which air with an air temperature within a predetermined range is supplied under the condition that the air amount takes precedence, or one in which air with a predetermined air temperature and a predetermined air amount is supplied under the condition that neither the air amount nor the air temperature are prioritized, can only be presumed, so that the air conditioner which can supply air with the predetermined air amount temperature of which is strictly controlled has been desired so far.

Patent Document 1: JP6049936B

Patent Document 2: JP2010-67896A

SUMMARY OF THE INVENTION

The present invention has been made in view of the above circumstances, and it is therefore an object of the present invention to provide an air conditioner which is capable of supplying air with a predetermined air amount the temperature of which is strictly adjusted.

Further, it is an object of the present invention to provide an air conditioner which is used for conveying substrates in a floating manner by jetting air from below toward substrates, an unit for floating conveying substrates with such an air conditioner, and a method of supplying air used for conveying substrates in a floating manner which are capable of maintaining a temperature around substrates required in accordance with the process of substrates to be constant, while at the same time, capable of strictly adjusting a temperature required for processing substrates free of control, irrespective of the temperature variations around substrates due to the floating conveyance of substrates.

In view of the above technical problems, according to an aspect of the invention, there is provided an air conditioner comprising:

a blower unit which includes a blower blowing air at a predetermined air amount, a cooling unit arranged on a downstream side of the blower unit in an air flowing direction in which a compressor which is operated at a variable operating frequency so that a revolving speed thereof is adjustable, a condenser, and a cooling coil are connected in this order by pipes in order to circulate a heating medium to cool blown air, a heating unit arranged on a downstream side of said cooling unit in the air flowing direction in which the blown air is heated by a heater, and a control unit which controls the operating frequency of the compressor, said control unit includes a compressor control part which adjusts the revolving speed of the compressor in such a way that the operating frequency of the compressor is decreased by a predetermined frequency when an output of the heating unit exceeds a first threshold value, while, the operating frequency of the compressor is increased by the predetermined frequency when the output of the heating unit falls below the first threshold value.

According to the air conditioner with the above structure, when the temperature of air, which is blown at a predetermined air amount by the blower, is controlled by the cooling unit and the heating unit, the stability of the control can be secured in such a way that the load of the compressor can be mitigated while air with a predetermined air amount temperature of which is strictly adjusted can be supplied without a need to adjusting the air amount, by the fact that the control of the heating unit by the thermal dose control part takes precedence over the control of the revolving speed of the compressor by the compressor control part.

In a preferred embodiment of the present invention, the compressor control part adjusts the revolving speed of the compressor in such a way that the operating frequency of the compressor is decreased by the predetermined frequency when the output of the heating unit exceeds the first threshold value, while, the operating frequency of the compressor is increased by the predetermined frequency when the output of the heating unit falls below a second threshold value, which is smaller than the first threshold value.

In view of the above technical problems, according to an aspect of the invention, there is provided an air conditioner comprising:

a blower unit which includes a blower blowing air at a predetermined air amount, a cooling unit arranged on a downstream side of the blower unit in an air flowing direction in which a compressor which is operated at a variable operating frequency so that a revolving speed thereof is adjustable, a condenser, and a cooling coil are connected in this order by pipes in order to circulate a heating medium to cool blown air, a heating unit in which a blown air is heated by a heating coil in such a way that a part of the heating medium flowing out from the compressor toward the condenser is caused to diverge to return to flow into the condenser at the downstream side of the compressor through the heating coil and a thermal dose adjusting valve arranged on the downstream side of the heating coil, an air temperature sensor which is arranged on an injecting opening through which air having passed through the cooling and heating units is jetted, a control unit which controls the operating frequency of the compressor and the opening of the thermal dose adjusting valve, the control unit includes a thermal dose control part which sets a target source temperature of the air whose temperature is to be controlled, and, by means of a PID calculation based on a difference between a temperature detected by the air temperature sensor and the target source temperature, calculates an opening manipulated variable of the thermal dose adjusting valve for conforming the temperature detected by the air temperature sensor to the target source temperature; and controls the opening of the thermal dose adjusting valve in accordance with the opening manipulated variable; and a compressor control part which adjusts the revolving speed of the compressor in such a way that the operating frequency of the compressor is decreased by a predetermined frequency when the opening manipulated variable of the thermal dose adjusting valve, which is calculated by the thermal dose control part, exceeds a first threshold value over a first predetermined period time, while, the operating frequency of the compressor is increased by the predetermined frequency when the opening manipulated variable of the thermal dose adjusting valve, which is calculated by the thermal dose control part, falls below the first threshold value over the first predetermined period time.

Further, in a preferred embodiment of the present invention, the compressor control unit which adjusts the revolving speed of the compressor in such a way that the operating frequency of the compressor is decreased by the predetermined frequency when the opening manipulated variable of the thermal dose adjusting valve exceeds the first threshold value over the first predetermined period of time, while, the operating frequency of the compressor is increased by the predetermined frequency when the opening manipulated variable of the thermal dose adjusting valve falls below a second threshold value, which is smaller than the first threshold value, over the first predetermined period of time.

Further, in a preferred embodiment of the present invention, the thermal dose control part calculates, as the opening manipulated variable of the thermal dose adjusting valve, an average value of the manipulated variable calculation values of the thermal dose adjusting valve, which are calculated by means of the PID calculation based on the difference between the temperature detected by the air temperature sensor and the target source temperature, over a second predetermined period of time which is set, in accordance with the first predetermined period of time.

Further, in a preferred embodiment of the present invention, air supplied by the air conditioner is used for conveying the substrate in a floating manner, the air conditioner further comprises an air passage path in which air blown by the blower passing through the cooling and heating units is flown and on a tip end of which an air injecting opening is provided so as to be upwardly oriented, the air temperature sensor is disposed on a position where a temperature of air which is jetted upwardly from the air injecting opening toward the underside of the substrate can be detected, the air passage path includes material with a predetermined heat capacity and/or a predetermined length and/or a predetermined thickness so as to alleviate the temperature variations around the substrate caused by the pressure variations which occurs when the substrate is conveyed to pass over the air injecting opening.

Further, in a preferred embodiment of the present invention, the air passage path is an air pipe which is provided so as to communicate the blower with the air injecting opening.

Further, in a preferred embodiment of the present invention, the air pipe is selected from material including a predetermined thermal conductivity.

Further, in a preferred embodiment of the present invention, the air pipe is made of stainless steel.

Further, in a preferred embodiment of the present invention, the cooling unit further comprises an expansion valve between the condenser and the cooling coil and a pressure sensor which detects a pressure inside the air pipe on the downstream side of the cooling coil, the control unit further includes a heating medium pressure control part which controls an opening of the expansion valve, the heating medium pressure control part calculates, by means of a PID calculation based on a difference between a pressure detected by the pressure sensor and a preset target pressure, an opening manipulated variable of the expansion valve for conforming the pressure detected by the pressure sensor to the target pressure, and controls the opening of the expansion valve in accordance with the opening manipulated variable.

Further, in a preferred embodiment of the present invention, the first predetermined time period is set between 10 seconds and 30 seconds.

Further, in a preferred embodiment of the present invention, the second predetermined time period is set in a range of from 1/10 to 5/10 of the first predetermined period of time.

Further, in a preferred embodiment of the present invention, the unit for floating conveying substrates, comprising a plurality of floating units for conveying substrate arranged along a direction in which the substrates are conveyed, each of which includes on its upper surface an air injecting opening through which air is jetted upwardly, and the air conditioner according to any of claims 5 to 12 which is communicated with the plurality of floating units so as to supply air toward the corresponding air injecting opening.

In view of the above technical problems, according to an aspect of the invention, there is provided a method of supplying air for floating conveying substrates wherein the substrates are conveyed in a floated manner by jetting air from below toward an underside of the substrate comprising:

a step of setting an air amount at which air is jetted from an air injecting opening, a step of adjusting air temperature when the air is jetted from the air injecting opening, and a step of alleviating a temperature variation caused by the air pressure variation without the air flow rate being adjusted when the conveyed substrate passes over the air injecting opening, by setting the material and/or the length and/or the thickness of an air passage path up to the air injecting opening.

Further, in a preferred embodiment of the present invention, the air passage path is an air pipe which is provided so as to communicate the blower blowing air toward the air injecting opening, with the air injecting opening.

Further, in a preferred embodiment of the present invention, the step of adjusting air temperature includes a step of setting the target source temperature of air whose temperature is to be controlled to effect a PID calculation, based on a difference between the detected air temperature and the target source temperature.

Further, in a preferred embodiment of the present invention, the step of adjusting air temperature includes a step of cooling air through a latent heat exchange between the heating medium and the air, while, of heating air through a sensible heat exchange so as to adjust the step of cooling air, in accordance with the step of heating air.

PREFERRED EMBODIMENT

A preferred embodiment of the air conditioner, and the unit for floating conveying substrates with such an air conditioner will be described in detail below by exemplifying a case in which the air conditioner of the present invention being applied to a system for conveying and processing substrates, for instance, with reference to the drawings.

In the system 100 for conveying and processing substrates, a predetermined amount of liquid, gas, light, heat, or the like is applied to a surface to be processed of a substrate, while the substrate on a substrate conveying line L is conveyed in a floated manner in one horizontal direction, and a predetermined process is performed in various processing steps. More specifically, with respect to a glass substrate for LCD, for instance, to be processed, and a series of processes such as cleaning in a photolithography process, resist coating, pre-baking, development, and post-baking are performed in an LCD manufacturing process.

As shown in FIG. 1, in the system 100 for conveying and processing substrates, a loading unit 120 for loading the substrate G, an unloading unit 140 for unloading the substrate G, and a processing unit 160 for processing the substrate G disposed between the loading unit 120 and the unloading unit 140 are arranged along the substrate conveying line L.

In the loading unit 120, a loading robot (not shown) is provided on a stage 180 provided on one end of the substrate conveying line L on which the substrate rests in order for the substrate G to be taken up from a cassette C and loaded on the substrate stage 180.

Similarly, in the unloading unit 140, a unloading robot (not shown) is provided on a substrate stage 200 provided on one end of the substrate conveying line L on which the substrate rests in order for the substrate G which has been processed to be housed in a cassette C.

The unit 160 for processing substrates includes a plurality of floating units 220, each of which floats the substrate G by a predetermined floating height, and a means 240 for conveying substrates which conveys the substrate G floated by the predetermined floating height in the direction of the substrate conveying line L. An air conditioner 260 is provided on each of the plurality of floating units 220 in order to maintain a local temperature around the substrate G floated by the predetermined floating height, to be constant. In this connection, the air conditioner 260 may be shared in the plurality of floating units 220 in order for air to be supplied and used for floating the substrate G by the predetermined floating height.

The means 240 for conveying substrates is constituted by a plurality of driving rollers (not shown) which are provided on the adjacent units 160 for processing substrates and are arranged between the plurality of floating units 220, for instance. The plurality of driving rollers are configured to be rotationally driven via a transmission mechanism (not shown) including a driving belt, a gear, and the like by a dedicated roller driving unit including a motor or the like. In the floating unit 220 described below, the substrate floated by jetted air can be conveyed along the substrate conveying line L by a rotational force of the driving rollers being transmitted to the substrate G.

As shown in FIG. 2, an upper surface of each of the floating units 220, i. e., a floating surface 280, is flat from a corner to a corner. On the floating surface 280, a large number of air injecting openings 300 for jetting a gas such as a high-pressure gas or a positive pressure gas, e.g., compressed air, and a large number of air suction openings 320 for sucking air in a vacuum are provided in a mixed form in a suitable arrangement pattern.

When the substrate G is conveyed on the floating units 220, a vertical upward force is applied to the substrate G from the air injecting openings 300 by compressed air, and simultaneously a vertical downward force by a vacuum suction force is applied to the substrate G through the air suction openings 320 to control the balance of both opposing forces. The substrate floating height is maintained in the vicinity of a set value (tens of μm) suitable for the floating conveyance and the substrate processing.

The air injecting openings 300 of the floating units 220 are connected to an individual compressed air supply unit (not shown) also communicated with the air conditioner 260 described below, and the injection pressure or the floating pressure thereof may be independently adjusted, in each of the floating units 220. Further, the air suction openings 320 of the floating units 220 are connected to separate vacuum sources (not shown), respectively, and the respective suction forces may be independently adjusted.

Accordingly, while the substrate G is conveyed, the substrate G is caused to float on each of the floating units 220 by an air layer formed between the substrate G and the upper surface of each of the floating units 220 based on the air pressure jetted upwardly from the air injecting openings 300.

A warp of the substrate G can be corrected by adjusting the balance between the air pressure jetted from the air injecting openings 300 and the air negative pressure caused by air being sucked.

As described in detail below, the air pressure is caused to vary, so that a local temperature around the substrate G can temporality vary by the fact that the substrate G covers the air injecting openings 300 during its conveyance. In this connection, such a mechanism for conveying the substrate G in a floating manner is also provided on each of the loading unit 120 and the unloading unit 140.

Next, a schematic structure of the air conditioner 260 in this embodiment is described.

As shown in FIG. 3, the air conditioner 260 includes: a cooling unit 10 in which a compressor 11 which is operated at a variable operating frequency so that a revolving speed thereof is adjustable, a condenser 12, an expansion valve 13 and a cooling coil 14 are connected in this order by pipes 15 in order to circulate a heating medium; a heating unit 20 which causes a part of the heating medium flowing out from the compressor 11 toward the condenser 12 to diverge, and causes it to return to flow into the condenser 12 on a downstream side of the compressor 11, through a heating coil 21 and a thermal dose adjusting valve 22 disposed on the downstream side thereof; an air passage path is an air pipe 30 which accommodates the cooling coil 14 and the heating coil 21, and communicates an inlet 31 for taking in an air whose temperature is to be controlled with the air injecting openings 300 through which air whose temperature is to be controlled is jetted, and a blower 60 which causes air to flow from the inlet 31 to the air injecting openings 300; a first temperature sensor 41 which detects the temperature of air before it is jetted from the air injecting openings 300; a second temperature 43 disposed near the substrate G to which air is jetted from the air injecting openings 300; a pressure sensor 44 which detects a pressure in the pipe on the downstream side of the cooling coil 14; an air amount sensor 61 which detects an air amount of air blown by the blower 60, and a control unit 50 which controls the operating frequency of the compressor 11, an opening of the expansion valve 13, and an opening of the thermal dose adjusting valve 22, etc.

Although FIG. 1 shows that the first temperature sensor 41 is distant from the air injecting openings 300 for the sake of illustration, the first temperature sensor 41 is located in a given layout by which it can detect a temperature of air passing through the air injecting openings 300.

In FIG. 3, a plurality of arrows A show an air flow. As shown by the arrows A, in this air conditioner 260, after the air whose temperature is to be controlled having been taken into the blower 60 from the inlet 31 has passed through the cooling coil 14 and the heating coil 21, the air is jetted from the air injecting openings 300. The air jetted from the air injecting openings 300 is supplied to the substrate G. In this embodiment, the blower 60 is disposed on an upstream side of the cooling unit 14, so that air with a predetermined air amount blown by the blower 60 passes through the cooling unit 14 and the heating unit 21 to be jetted through the air injecting openings 300 toward the substrate G.

An air pipe 30 inside of which air blown by the blower 60 flows to pass through the cooling unit 10 and the heating unit 20 and at a tip end of which the air injecting openings 300 are provided so as to be upwardly oriented is further provided. The air pipe 30 is provided so as to connect between the blower 60 and the air injecting openings 300, and may be made of plastic. A metal pipe 31 is further provided near a position on the air pipe 30 where the temperature sensor 41 is provided. The metal pipe 31 is made of material with a predetermined heat capacity and/or includes a predetermined pipe length and/or a predetermined thickness so as to alleviate the temperature variation around the conveyed substrate G caused by the pressure variation of air which occurs while the substrate G is conveyed to pass over the air injecting openings 300, to limit such a temperature variation within a predetermined range. The metal pipe 31 may be preferably made of stainless steel.

Alternatively, instead of the air pipe with a closed cross section, an air passage path may be constituted by a portion of an inner surface of a casing housing the air conditioner 260 between the blower 60 and the floating unit 220 with the air injecting openings 300. In such a case, a portion of this air passage path may be made of material with a predetermined heat capacity and/or a predetermined area so as to alleviate the temperature variation around the conveyed substrate G to limit such a temperature variation within a predetermined range, or a short pipe portion for conveying air which is made of material with a predetermined heat capacity and/or includes a predetermined pipe length and/or a predetermined thickness so as to alleviate the temperature variation around the conveyed substrate G to limit such a temperature variation within a predetermined range may be provided within the air passage path.

With respect to the material, the length and the thickness of the air passage path, the responsiveness may preferably be loosened so as to restrict the temporary temperature variation around the substrate G caused by the fact that the substrate G is conveyed to pass over the air injecting openings 300 in one aspect, while, the responsiveness may preferably be enhanced so as to maintain the use temperature, which is an ambient temperature in a space in which the system 100 for conveying and processing substrates is arranged, to be constant in an accurate manner in another aspect. Accordingly, the material, the length and the thickness of the air passage path may preferably be determined so as to balance the above both aspects.

In this air conditioner 260, the air whose temperature is to be controlled is cooled by the cooling coil 14 and heated by the heating coil 21, so that a temperature of the use area U is controlled to a preset target use temperature. A cooling capacity of the cooling coil 14 can be adjusted in accordance with an operating frequency of the compressor 11 and/or an opening of the expansion valve 13, while a heating capacity of the heating coil 21 can be adjusted in accordance with the operating frequency of the compressor 11 and/or an opening of the thermal dose adjusting valve 22. Adjusting operations of the cooling capacity and the heating capacity are performed by the aforementioned control unit 50 which adjusts the operating frequency of the compressor 11, the opening of the expansion valve 13, and the opening of the thermal dose adjusting valve 22.

Now, each of the components of the air conditioner 260 will be described below.

In the blower unit, the air amount sensor 61 is provided on a downstream side of the heating unit 20, and the air amount is adjusted by discharging an excessive air amount by an exhaust, so that the air amount can be maintained to be constant, based on the air amount detected by means of the air amount sensor 61, without a need to controlling the output of the blower 60.

In this connection, a chemical filter F is provided as a pre-filter on an upstream side of the blower 60, and a high efficiency particulate air filter F is provided between the cooling unit 10 and the heating unit 20.

In the cooling unit 10, the compressor 11 is configured to compress a gaseous heating medium having a low temperature and a low pressure, which has flowed out from the cooling coil 14, into a gaseous heating medium having a high temperature (e.g., 80° C.) and a high pressure, and is configured to supply it to the condenser 12. The compressor 11 is an inverter compressor which is operated at a variable operating frequency so that a revolving speed thereof is adjustable, in accordance with the operating frequency. In the compressor 11, when the operating frequency is increased, a larger amount of the heating medium is supplied to the condenser 12. As the compressor 11, a scroll type compressor having an inverter and a motor together is preferably employed. However, as long as a feed rate (flow rate) of the heating medium can be adjusted by adjusting the operating frequency by an inverter to adjust the revolving speed, the type of the compressor 11 is not particularly limited.

The condenser 12 is configured to cool and condense the heating medium compressed by the compressor 11 by means of cooling water into a liquid heating medium having a predetermined cooled temperature (e.g., 40° C.) and a high pressure, and is configured to supply it to the expansion valve 13. Water can be used as the cooling water of the condenser 12, or another coolant can be used. The expansion valve 13 is configured to expand the heating medium supplied from the condenser 12 to decompress it into a heating medium in a gas-liquid mixture state, which has a low temperature (e.g., 2° C.) and a low pressure, and is configured to supply it to the cooling coil 14. The cooling coil 14 is configured to heat-exchange the supplied heating medium with the air whose temperature is to be controlled so that the air is cooled. The heating medium having been heat-exchanged with the air becomes a gaseous heating medium having a low temperature and a low pressure, and the heating medium is configured to flow out from the cooling coil 14 so as to be again compressed by the compressor 11.

In such a cooling unit 10, a feed rate of the heating medium to be supplied to the condenser 12 can be adjusted by varying the operating frequency of the compressor 11 so as to adjust the revolving speed, as well as a feed rate of the heating medium to be supplied to the cooling coil 14 can be adjusted because the opening of the expansion valve 13 can be adjusted. Such adjustment enables the cooling capacity to be varied.

On the other hand, in the heating unit 20, the heating coil 21 has a heating medium entrance and a heating medium exit. The heating medium entrance and an upstream side of a pipe 15A between the compressor 11 and the condenser 12 are connected by a supply pipe 25. On the other hand, the heating medium exit and a downstream side of the pipe 15A are connected by a return pipe 26. The return pipe 26 is equipped with the thermal dose adjusting valve 22. Thus, the heating unit 20 can cause a part of the heating medium flowing out from the compressor 11 toward the condenser 12 to diverge, and can cause it to return to flow into the condenser 12, through the heating coil 21 and the thermal dose adjusting valve 22.

In the heating unit 20, a gaseous heating medium, which has been compressed by the compressor 11 to have a high temperature (e.g., 80° C.) and a high pressure, is supplied to the heating coil 21. The heating coil 21 is configured to heat-exchange the supplied heating medium with the air whose temperature is to be controlled so as to heat the air. The heating medium, which has been heat-exchanged with the air, is configured to return from the heating coil 21 to the pipe 15A through the return pipe 26. By means of the thermal dose adjusting valve 22 which adjusts an amount of the heating medium returning from the heating coil 21 to the pipe 15A, a heating capacity of the heating coil 21 can be varied. The more the returning amount of the heating medium becomes, the more the heating capacity increases.

FIG. 4 is a block diagram of the control unit 50. As shown in FIG. 4, the control unit 50 in this embodiment includes a thermal dose control part 51 which controls the opening of the thermal dose adjusting valve 22, a compressor control part 52 which controls the operating frequency of the compressor 11, a heating medium pressure control part 53 which controls the opening of the expansion valve 13; a first pulse converter 55 connected to the thermal dose control part 51, and a second pulse converter 56 connected to the heating medium pressure control part 53. A target use temperature, which is a target temperature around the substrate G, and a target pressure of the heating medium in the cooling unit 10 are inputted to the control unit 50.

The thermal dose control part 51 is configured to set a target source temperature of the air whose temperature is to be controlled passing through the air injecting openings 300, based on a difference between a temperature detected by the second temperature sensor 43 and the target use temperature preset for the substrate G, to calculate, by means of a PID calculation based on a difference between a temperature detected by the first temperature sensor 41 and the aforementioned target source temperature, an opening manipulated variable of the thermal dose adjusting valve 22 for conforming the temperature detected by the first temperature sensor 41 to the aforementioned target source temperature; and to control (PID control) the opening of the thermal dose adjusting valve 22 in accordance with the opening manipulated variable. The opening manipulated variable means the opening of the thermal dose adjusting valve 22. When the thermal dose adjusting valve 22 is full closed, a value of the opening manipulated variable is 0%, and when full opened, a value thereof is 100%.

In more detail, the thermal dose control part 51 in this embodiment outputs the calculated opening manipulated variable to the first pulse converter 55, and the first pulse converter 55 calculates a pulse signal corresponding to the opening manipulated variable and transmits it to the thermal dose adjusting valve 22. Thus, the opening of the thermal dose adjusting valve 22 is adjusted to the calculated opening manipulated variable. Although not shown, the opening of the thermal dose adjusting valve 22 is adjusted by a stepper motor that is driven in accordance with the pulse signal from the first pulse converter 55. The aforementioned target source temperature is a temperature by which a temperature of the substrate G can reach the target use temperature, when the air whose temperature is to be controlled is supplied to the substrate G. A relationship between the target source temperature and the target use temperature may be specified by a calculation or an experiment, based on a positional relationship between the air conditioner 260 and the substrate G, etc.

In addition, after the thermal dose control part 51 in this embodiment has directly calculated the manipulated variable calculation values of the thermal dose adjusting valve 22 by means of the PID calculation based on the difference between the temperature detected by the first temperature sensor 41 and the target source temperature, the thermal dose control part 51 is configured to calculate, as the aforementioned opening manipulated variable of the thermal dose adjusting valve 22, a moving average value of the manipulated variable calculation values.

When observed in a chronological order, the manipulated variable calculation values, which are directly calculated by means of the PID calculation, are sometimes calculated to include a lot of harmonics. When the manipulated variable calculation values observed as such harmonics are handled as actual manipulated variables, a control system may be disturbed. Thus, in this embodiment, in order to restrain an influence of the manipulated variable calculation values observed as harmonics, a moving average value of the manipulated variable calculation value is calculated as the aforementioned opening manipulated variable of the thermal dose adjusting valve 22. Thus, the control can be stabilized.

Following thereto, the compressor control part 52 is configured to adjust the revolving speed of the compressor 11; by decreasing the operating frequency of the compressor 11 by a predetermined frequency when the aforementioned opening manipulated variable of the thermal dose adjusting valve 22 exceeds a first threshold value over a predetermined period of time; and by increasing the operating frequency of the compressor 11 by the predetermined frequency when the aforementioned opening manipulated variable of the thermal dose adjusting valve 22 falls below a second threshold value, which is smaller than the first threshold value, over the predetermined period of time.

According to the compressor control part 52, when the opening manipulated variable of the thermal dose adjusting valve 22 exceeds the first threshold value over the predetermined period of time, the compressor control part 52 judges that the cooling capacity is excessive, and the compressor control part 52 decreases the operating frequency of the compressor 11 to decrease the revolving speed, whereby the cooling capacity can be decreased. On the other hand, when the opening manipulated variable of the thermal dose adjusting valve 22 falls below the second threshold value, which is smaller than the first threshold value, over the predetermined period of time, the compressor control part 52 judges that the cooling capacity is insufficient, and the compressor control part 52 increases the operating frequency of the compressor 11 to increase the revolving speed, whereby the cooling capacity can be increased. Thus, a temperature of air whose temperature is to be controlled can be appropriately controlled.

The compressor control part 52 in this embodiment is configured to perform the judgment of whether to increase or decrease the operating frequency of the compressor 11 based on a behavior of the opening manipulated variable of the thermal dose adjusting valve 22 in the predetermined period of time after the predetermined period of time has elapsed. Such a process is performed such that the operating frequency of the compressor 11 is not frequently varied, in order to improve the control accuracy by restraining a disturbance influence on the control system caused by variation in cooling capacity and heating capacity. The above "predetermined period of time" is a value that is variable depending on characteristics of the air conditioner 260, but is preferably set between 10 seconds and 30 seconds, preferably between 15 seconds and 25 seconds, and more preferably 20 seconds, for example, in consideration of a practical time required to reach the target use temperature without frequently varying the operating frequency of the compressor 11.

In addition, as described above, the thermal dose control part 51 calculates the opening manipulated variable as the moving average value of the manipulated variable calculation values directly calculated. An interval at which the moving average value is calculated is a time shorter than the aforementioned "predetermined period of time". For example, the interval at which the moving average value is calculated may be set in a range of from 1/10 to 6/10 of the aforementioned "predetermined period of time".

In addition, according to the control of the compressor control part 52, the opening of the thermal dose adjusting valve tends to converge between the aforementioned "first threshold value" and the "second threshold value", as the control of a temperature to the target use temperature becomes stable. In the case where the opening converges, when the opening of the thermal dose adjusting valve 22 has a relatively large value, such a large opening is not preferable in terms of power saving. Thus, although the "first threshold value" and the "second threshold value" are values that are variable depending on characteristics of the air conditioner 260, they are preferably set between 5 and 30%, on the assumption that the full open state of the opening of the thermal dose adjusting valve 22 is 100%.

Further, the "predetermined frequency" by which the thermal dose control part 51 increases or decreases the operating frequency of the compressor 11 in accordance with the opening manipulated variable is preferably a relatively small value, from the viewpoint of restraining a disturbance influence on the control system caused by variation in cooling capacity and heating capacity. This "predetermined frequency" is a value that is variable depending on characteristics of the air conditioner 260 and a type of the motor of the compressor 11, but is preferably set about 1 Hz to 4 Hz, for example, in consideration of a practical time required to reach the target use temperature without frequently varying the operating frequency of the compressor 11.

Alternatively, in a case where a disturbance influence caused by the variation of the cooling and heating capacities on the control system is small, due to the characteristics of the air conditioner 260 and the type of the motor of the compressor 11, the operating frequency of the compressor 11 may be decreased by the predetermined frequency when the opening manipulated variable of the thermal dose adjusting valve 22, which is calculated by the thermal dose control part 51, exceeds a first threshold value over a first predetermined period time, while, the operating frequency of the compressor 11 may be increased by the predetermined frequency when the opening manipulated variable of the thermal dose adjusting valve 22, which is calculated by the thermal dose control part 51, falls below the first threshold value over the first predetermined period time.

As described above, in a case where the air temperature is controlled by air with the predetermined air amount by means of the air conditioner 260, following advantages on the temperature control can be accomplished by the fact that the control of the heating unit 20 takes precedence over the control of the cooling unit 10 which is effected, in accordance with the output of the control of the heating unit 20.

Firstly, the operating frequency of the compressor 11 does not have to be frequently varied, in order to improve the control accuracy by restraining a disturbance influence on the control system caused by variation in cooling capacity and heating capacity.

Namely, unlike this embodiment, when a valve for adjusting a flow rate is disposed on the upstream side of the heating coil 21, the valve controls the gaseous heating medium having a high temperature and a high pressure, coming from the compressor 11. It is more difficult to accurately control a flow rate of a gaseous heating medium than to control a flow rate of a liquid heating medium. Moreover, a robust structure that can withstand a high-temperature and high-pressure heating medium is needed. On the other hand, in this embodiment, since the thermal dose adjusting valve 22 is disposed on the downstream side of the heating coil 21, the thermal dose adjusting valve 22 can control a flow rate of the heating medium that has passed through the heating coil 21 so as to be liquefied. Furthermore, since the heating medium has a lowered temperature, the thermal dose adjusting valve 22 of a relatively simple structure can even withstand the temperature of the heating medium. Thus, the accuracy in controlling a temperature to a target temperature can be improved, and the air conditioner 260 can be simplified as a whole because of the simple thermal does adjusting valve 22.

Secondly, unlike this embodiment, when the heating medium, which has passed through the heating coil 21 so as to be liquefied, flows into the compressor 11, a so-called liquid back phenomenon occurs. In the liquid back phenomenon, a lubrication oil supplied to a movable part in the compressor 11 may flow out, which invites seizure. In addition, since the compressor 11 compresses the liquid, the operation stability of the compressor 11 may be impaired. On the other hand, in this embodiment, since the heating medium is returned to the downstream side of the compressor 11, it is possible to prevent the seizure of a member in the compressor 11 and the unstable operation of the compressor 11. As a result, the air conditioner 260 can be smoothly operated, whereby the accuracy in controlling a temperature to a target temperature can be improved.

Thirdly, since whether to increase or decrease the operating frequency of the compressor 11 is judged based on a behavior of the opening manipulated variable of the thermal dose adjusting valve 22 in the predetermined period of time after the predetermined period of time has elapsed, the operating frequency of the compressor 11 is varied in a stepwise manner, and thus, the operating frequency can be prevented from being abruptly varied. Thus, a disturbance influence caused by variation in cooling capacity and heating capacity in accordance with the variation in operating frequency can be restrained. Thus, the accuracy in controlling a temperature to a target temperature can be improved.

Now, based on the above structure, the effect derived from the air conditioner, and the unit for floating conveying substrates with the air conditioner of the present invention, along with a method of floating conveying substrates will be explained about.

Firstly, in the loading unit 120, the substrate G which is to be processed is taken out of cassette C to be loaded on the substrate stage 180 by the loading robot (not shown).

Then, the floating units 220 and devices associated with the floating units 220 are all kept switched on when or while the unit 160 for processing substrates is operated. More specifically, the driving rollers are driven so as to be rotated, and air is supplied to each of the air injecting openings 300 on the floating units 220, while a vacuum state is caused in order to generate a suction pressure through the air suction openings 320.

Next, an operation of the air conditioner 260 in this embodiment is described.

In the air conditioner 260 in this embodiment, a target use temperature, which is a target temperature of the substrate G, and a target pressure of the heating medium in the cooling unit 10 are firstly inputted to the control unit 50. In addition, the blower 60 is driven so that air flows toward the air injecting openings 300. Thus, the temperature control air is taken in by the blower 60. Further, the compressor 11 of the cooling unit 10 is driven.

The air taken in by the blower 60 firstly passes through the cooling coil 14 and then passes through the heating coil 21. Thereafter, the air is jetted through the air injecting openings 300 to reach the substrate G. At this time, a temperature of the air before it is jetted from the air injecting openings 300 is detected by the first temperature sensor 41. In addition, an ambient temperature around the substrate G is detected by the second temperature sensor 43, and a pressure of the heating medium on the downstream side of the cooling coil 14 is detected by the pressure sensor 44, while, the air amount of air blown by the blower 60 is detected by the air amount sensor 61. The first temperature sensor 41 outputs the detected temperature to the control unit 50. The second temperature sensor 43 outputs the detected temperature to the control unit 50, and the pressure sensor 44 outputs the detected pressure to the control unit 50.

In the control unit 50, the thermal dose control part 51 sets a target source temperature of the air whose temperature is to be controlled passing through the air injecting openings 300, based on a difference between a temperature detected by the second temperature sensor 43 and the target use temperature preset for the substrate G; calculates, by means of a PID calculation based on a difference between a temperature detected by the first temperature sensor 41 and the aforementioned target source temperature, an opening manipulated variable of the thermal dose adjusting valve 22 for conforming the temperature detected by the first temperature sensor 41 to the aforementioned target source temperature; and controls the opening of the thermal dose adjusting valve 22 in accordance with the opening manipulated variable.

In addition, the compressor control part 52 adjusts the revolving speed of the compressor 11: by decreasing the operating frequency of the compressor 11 by a predetermined frequency, when the above opening manipulated variable of the thermal dose adjusting valve 22 exceeds a first threshold value over a predetermined period of time; and by increasing the operating frequency of the compressor 11 by the predetermined frequency, when the above opening manipulated variable of the thermal dose adjusting valve 22 falls below a second threshold value, which is smaller than the first threshold value, over the predetermined period of time.

In addition, the heating medium pressure control part 53 calculates, by means of a PID calculation based on a difference between a pressure detected by the pressure sensor 44 and the preset target pressure, an opening manipulated variable of the expansion valve 13 for conforming the pressure detected by the pressure sensor 44 to the aforementioned target pressure, and controls the opening of the expansion valve 13 in accordance with the opening manipulated variable.

Due to the above control operations of the thermal dose control part 51, the compressor control part 52, and the heating medium pressure control part 53, the temperature around the substrate G is controlled toward the target use temperature.

According to the air conditioner 260, in the unit 160 for processing substrates, the substrate G is loaded on the floating unit 220 along the substrate conveying line L by the driving rollers.

In such a case, when the substrate G begins to pass through the floating unit 220, the plurality of air injecting openings 300 provided on the upper surface of the floating unit 220 are gradually covered by the substrate G, whereby the air pressure jetting from the air injecting openings 300 starts to rapidly increase, and air temperature increases due to the rapid increase of the air pressure.

In the air conditioner 260 of this embodiment, since the air pipe provided near a position of the air pipe 30 where the temperature sensor 41 is provided is made of stainless steel with a high thermal conductivity, and includes a thickness and a pipe length with a high heat capacity, the temperature variation due to the pressure variation caused by the substrate G being conveyed is alleviated. More specifically, the air amount by the blower 60 is not controlled in response to the pressure variation caused by the conveyance of the substrate G, and the air temperature is not controlled by the cooling unit 10 and the heating unit 20 in the air conditioner 260 under the condition that the air amount is constant. In other words, the temperature variation due to the pressure variation can be restricted free of control.

As described above, in the unit 160 for processing substrates, the substrate G is processed while it is conveyed along the substrate conveying line L in a floated manner.

Then, in the loading unit 140, the substrate G on the substrate stage 180 which has been processed is stored in the cassette C by the loading robot (not shown).

The loading process into the substrate stage 180, the conveyance process by air, the processing process, and the unloading process from substrate stage 180 are repeated in a sequential manner for a plurality of substrates.

In this connection, the air conditioner 260 may be operated in advance in order to maintain a local ambient temperature (use temperature) in the system 100 for conveying and processing substrates, for instance, to be a predetermined temperature, while at the same time, in order to supply air with an adjusted predetermined air amount and a predetermined temperature when the loaded substrate G is to be floated.

According to the air conditioner with the above structure, when the temperature of air, which is blown at a predetermined air amount by the blower 60, is controlled by the cooling unit 10 and the heating unit 20, the stability of the control can be secured in such a way that the load of the compressor can be mitigated while air with a predetermined air amount temperature of which is strictly adjusted can be supplied without a need to adjusting the air amount by the fact that the control of the heating unit 20 by the thermal dose control part takes precedence over the control of the revolving speed of the compressor 11 by the compressor control part 52.

It is presumed that, in a case where the temperature of air taken in by the blower 60 is higher than the target air temperature, the heating unit 20 is not operated, while the cooling unit 10 is operated, or that in a case where the temperature of air taken in by the blower 60 is lower than the target air temperature, the heating unit 20 is operated, while the cooling unit 10 is not operated.

In both cases, the following technical advantages on the temperature control of air are attained under the condition that both of the cooling unit 10 and the heating unit 20 are operated simultaneously.

Firstly, according to the structure in which a part of the heating medium having passed through the heating coil 21 is returned to the downstream side of the compressor 11 (upstream side of the condenser 12), the heating medium, which has passed through the heating coil 21 so as to be liquefied, returns to the condenser 12. Thus, the heating medium, which has passed through the heating coil 21 so as to be liquefied, can be prevented from flowing into the compressor 11, whereby the air conditioner 260 can be smoothly operated. As a result, the accuracy in controlling a temperature to a target temperature can be improved.

Secondly, the thermal dose adjusting part 51 sets a target source temperature of the temperature control air passing through the air injecting openings 300, based on a difference between a temperature detected by the second temperature sensor 43 and a target use temperature preset for the ambient temperature around substrate G; calculates, by means of a PID calculation based on a difference between a temperature detected by the first temperature sensor 41 and the target source temperature, an opening manipulated variable of the thermal dose adjusting valve 22 for conforming the temperature detected by the first temperature sensor 41 to the target source temperature; and controls the opening of the thermal dose adjusting valve 22 in accordance with the opening manipulated variable. Thus, by taking into consideration of influences of disturbance and responsiveness when the temperature control air (the air whose temperature is to be controlled) having passed through the air injecting openings 300 reaches the substrate G, it is possible to obtain an accurate opening manipulated variable of the thermal dose adjusting valve 22 for conforming a temperature around substrate G to the target use temperature by means of the temperature control air. Thus, the accuracy in controlling a temperature to a target temperature (target use temperature) can be improved.

Thus, the temporary temperature variation due to the pressure variation caused by the substrate G being conveyed can be alleviated by means of the air pipe in such a way that the air amount of the blower 60 is not controlled in response to such a temporary temperature variation, and thus, the fluctuation of the floating height of the substrate is not caused, and that the cooling unit 10 and the heating unit 20 in the air conditioner 260 are not controlled.

Thirdly, the compressor control part 52 adjusts the revolving speed of the compressor 11; by decreasing the operating frequency of the compressor 11 by a predetermined frequency, when the opening manipulated variable of the thermal dose adjusting valve 22 exceeds a first threshold value over a predetermined period of time, and by increasing the operating frequency of the compressor 11 by the predetermined frequency, when the opening manipulated variable of the thermal dose adjusting valve 22 falls below a second threshold value, which is smaller than the first threshold value, over the predetermined period of time. Thus, when the opening manipulated variable of the thermal dose adjusting valve 22 exceeds the first threshold value over the predetermined period of time, the compressor control part 52 judges that the cooling capacity is excessive, and the compressor control part 52 decreases the operating frequency of the compressor 11 to decrease the revolving speed, whereby the cooling capacity can be decreased. On the other hand, when the opening manipulated variable of the thermal dose adjusting valve 22 falls below the second threshold value, which is smaller than the first threshold value, over the predetermined period of time, the compressor control part 52 judges that the cooling capacity is insufficient, and the compressor control part 52 increases the operating frequency of the compressor 11 to increase the revolving speed, whereby the cooling capacity can be increased. Thus, the temperature of air whose temperature is to be controlled can be appropriately controlled.

Fourthly, the heating medium pressure control part 53 calculates, by means of a PID calculation based on a difference between a pressure detected by the pressure sensor 44 and a preset target pressure, an opening manipulated variable of the expansion valve 13 for conforming the pressure detected by the pressure sensor 44 to the target pressure, and controls the opening of the expansion valve 13 in accordance with the opening manipulated variable. Thus, since the temperature of the heating medium flowing out from the cooling coil 14 can be stabilized, the cooling capacity is made stable. Thus, the accuracy in controlling a temperature to a target temperature can be improved.

Now, the second embodiment of the present invention will be described, with reference to FIG. 5. In the following description, the explanation of elements the same as those in the first embodiment is omitted by attaching the same reference numbers to said elements, and the technical feature of this embodiment will be described in detail.

The technical feature of this embodiment lies in the air conditioner 260 used for conveying the substrate G in a floating manner which includes the cooling unit 10 and the heating unit 20. The control of the heating unit 20 takes precedence over that of the cooling unit 10 on the condition that the cooling unit 10 and the heating unit 20 are operated simultaneously, similar to the first embodiment. However, in the first embodiment, a part of the heating medium flowing out from the compressor 11 toward the condenser 12 is diverged so as to return to the condenser 12 at the downstream side of the compressor 11 via the heating coil 21 and the thermal dose adjusting valve 22 provided on the downstream side of the heating coil 21, while, in this embodiment, air cooled by the cooling unit 10 is heated through a sensible heat exchange by means of an electrical heater without relying on a latent heat exchange by the gaseous heating medium with the high temperature (80° C., for instance) and the high pressure which is compressed by the compressor 11.

More specifically, the compressor control part 52 controls the revolving speed of the compressor 11 in such a way that, in a case where the output of the heater exceeds the first threshold value, the compressor control part 52 decreases the operating frequency of the compressor 11 by a predetermined frequency, while, in a case where the output of the heater falls below the first threshold value, the compressor control part 52 increases the operating frequency of the compressor 11 by the predetermined frequency. This means that, in a case where the output of the heater exceeds the first threshold value, the compressor control part 52 judges that the cooling capacity is excessive to decrease the cooling capacity by decreasing the operating frequency, and thus the revolving speed of the compressor 11, while, in a case where the output of the heater falls below the first threshold value, the compressor control part 52 judges that the cooling capacity is insufficient to increase the cooling capacity by increasing the operating frequency, and thus the revolving speed of the compressor 11. This causes the temperature of air to be appropriately controlled. The first threshold value may be set to be 10% of the total output of the heater, for instance.

Like FIG. 3 in the first embodiment, the air amount sensors 61A, 61B are provided on a downstream side of the heating unit 20.

Such being the case, in the first embodiment, the heating medium inlet and the upstream side of the pipe 15A between the compressor 11 and the condenser 12 are connected by the supply pipe 25, while, the heating medium outlet and the downstream side of the pipe 15A between the compressor 11 and the condenser 12 are connected by the return pipe 26 including the thermal dose adjusting valve 22, while, in this embodiment, the apparatus can be simplified so that its reliability can be improved by the supply pipe 25, the return pipe 26 and the thermal dose adjusting valve 22 being omitted.

In this connection, similar to the first embodiment, in a case where the output of the heater falls below a second threshold value additionally set so as to be smaller than the first threshold value, the compressor control part 52 may increase the operating frequency of the compressor 11 by the predetermined frequency, while, in a case where the output of the heater is between the first threshold value and the second threshold value, the compressor control part 52 may not adjust the operating frequency of the compressor 11.

Additionally, a temperature of the heating medium which has been cooled may be controlled by adjusting an injection valve 65 provided on a pipe 63 connecting a portion between the cooling unit 14 and the compressor 11 and a portion between the condenser 12 and the expansion valve 13, based on the air temperature detected by the temperature sensor 47 provided immediately behind the cooling unit 14 in the flowing direction of the heating medium.

The floating height of the substrate G can be fluctuated by the air amount of the blower in response to the pressure variation due to the conveyed substrate G. The quick detection of the temperature variation by the temperature sensor is required if the temperature of air is controlled by means of the cooling units 10 and the heating unit 20 of the air conditioner 260 in response to the pressure variation due to the conveyed substrate G, but it is technically difficult to attain the temperature control so as to timely follow up the temperature variation due to such a pressure variation.

According to the above embodiment, similar to the first embodiment, the substrate G which has to be under the strict temperature control can be conveyed in a floated manner while the air temperature required for the substrate G can be maintained by controlling the air temperature by means of the cooling units 10 and the heating unit 20 of the air conditioner 260, in response to the environmental fluctuation of the air temperature which the blower 60 takes in, and/or in accordance with the target preset temperature, without causing the above technical problems.

In this connection, in a case where the supplied air amount takes precedence over the adjustment of an ambient temperature so as to maintain the ambient temperature to be constant by supplying air, in this embodiment, even though the control of the heating unit 20 takes precedence over the control of the cooling unit 10, the cooling unit 10 may be controlled, in accordance with the amount of the output of the heating unit 20 (the electrical heater) without a close cooperation between the control of the cooling unit 10 and the control of the heating unit 20 in the air conditioner 260, unlike the first embodiment, so that the reliability of the air conditioner can be improved by a complication of the control system being avoided.

EMBODIMENT

The applicant carried out a test on pressure and temperature variations when the substrate G passes through the floating unit 220, based on the second embodiment of the system. 100 for conveying and processing substrates.

As shown in FIG. 6, the pressure and temperature variations when the substrate G passes through the floating unit 220 are illustrated. It takes about twenty seconds for the substrate G which is conveyed at a time interval of about 10 seconds to pass through the floating unit 220, and it also takes about twenty seconds for the next substrate G. During each of about twenty seconds, the pressure variation and the temperature variation caused by the pressure variation are shown.

More specifically, when the substrate G begins to pass through the floating unit 220, the plurality of air injecting openings 300 provided on the floating surface 280 of the floating unit 220 are gradually covered by the substrate G, whereby the air pressure jetting from the air injecting openings 300 starts to rapidly increase. Since the width of the floating unit 22 in the direction in which the substrate G is conveyed is longer than the length of the substrate G in the direction in which the substrate G is conveyed, the number of the air injecting openings 300 which are covered by the substrate G is constant, so that the increased pressure is kept constant, while, when the substrate G finishes passing through the floating unit 220, the increased pressure rapidly decreases to return to the initial pressure, since the number of the air injecting openings 300 which are covered by the substrate G is decreased.

On the other hand, although the air temperature increases from 23° C. due to the rapid increase of the air pressure, the inclination of the increase of the air temperature is substantially smaller than that of the increase of the air pressure. The air temperature is maintained to be about 23.05° C., and although the air temperature decreases from 23.05° C. to return to the initial temperature 23° C. due to the rapid decrease of the air pressure, the inclination of the decrease of the air temperature is substantially smaller than that of the increase of the air pressure, like the above case of the increase of the air temperature.

Such being the case, the air temperature is controlled to be within an error range between +0.05° C. and −0.05° C. relative to the target temperature 23° C., in response to the temporally temperature variation due to the pressure variation.

In this connection, as illustrated, the pressure and temperature variations caused by the next substrate G is almost the same.

As described above, the temperature variation due to the pressure variation is restricted to be in a range between 23° C. and 23.05° C. free of control. More specifically, the air amount of the blower 60 is neither controlled in response to the pressure variation caused by the conveyance of the substrate G, nor is the air temperature controlled by the cooling unit 10 and the heating unit 20 in the air conditioner 260 under the condition that the air amount is constant. This is because the temperature variation due to the pressure variation caused by the substrate G being conveyed is alleviated by the fact that the air pipe near the position where the temperature sensor 41 is provided is made of stainless steel with a high thermal conductivity and includes a predetermined thickness and a predetermined length so as to secure a high heat capacity.

As described above, the floating height of the substrate G can be fluctuated by the air amount of the blower in response to the pressure variation due to the conveyed substrate G. The quick detection of the temperature variation by the temperature sensor is required if the temperature of air is controlled by means of the cooling units 10 and the heating unit 20 of the air conditioner 260, in response to the pressure variation due to the conveyed substrate G, but it is technically difficult to attain the temperature control so as to timely follow up the temperature variation due to such a pressure variation.

On the other hand, according to the above embodiment, the substrate G which has to be under the strict temperature control can be conveyed in a floated manner while the air temperature required for the substrate G can be maintained to be constant by controlling the air temperature by means of the cooling unit 10 and the heating unit 20 of the air conditioner 260, in response to the environmental fluctuation of the temperature of air which the blower 60 takes in, and/or in accordance with the target preset temperature, without causing the above technical difficulty.

As stated above, the preferred embodiments of the present invention were described in detail, however, it is evident that those skilled in the art could modify or change the embodiments in various manners without departing from the scope of the present invention.

For instance, in the above embodiment, the system 100 for conveying and processing substrates was presumed, however, the present invention can be effectively applied to other situations, so long as air with a predetermined air amount its temperature is strictly controlled has to be supplied.

For instance, in the above embodiment, the substrate G to be processed is explained as the glass substrate G for LCD, however, the present invention can be effectively applied to other substrate such as the substrate G for a flat panel display, the wafer, the CD board, the photomask, the printed wiring board, etc., so long as the temperature around the substrate G which is conveyed in a floated manner and the floating height of the substrate G have to be strictly controlled.

For instance, in the above embodiment, the metal air pipe is provided near a position where the temperature sensor 41 is provided in order to alleviate the temperature variation due to the pressure variation caused by the fact that the substrate G passes through the floating unit 220, however, the metal air pipe may be provided on all of, or a portion of the air pipe between the blower 60 constituting an air source and the air injecting openings constituting air outlets, and in a case where the metal air pipe may be provided on a portion of such an air pipe, it may be provided near the air injecting openings 300, or it may be provided on a plurality of positions on a plastic pipe.

For instance, in the above embodiment, the system 100 for conveying and processing substrates was presumed, however, the present invention can be effectively applied to a conveying inspection system for the substrate, such as an inline inspection in a manufacturing process of FPD such as large LCD, PDP, a pattern inspection or the defection inspection of glass substrate G based on image date obtained by a various inspections of the glass substrates G using devices with line sensors, so long as the temperature around the substrate G conveyed in a floated manner and the floating height of the substrate G need to be strictly controlled.

Figure 1:
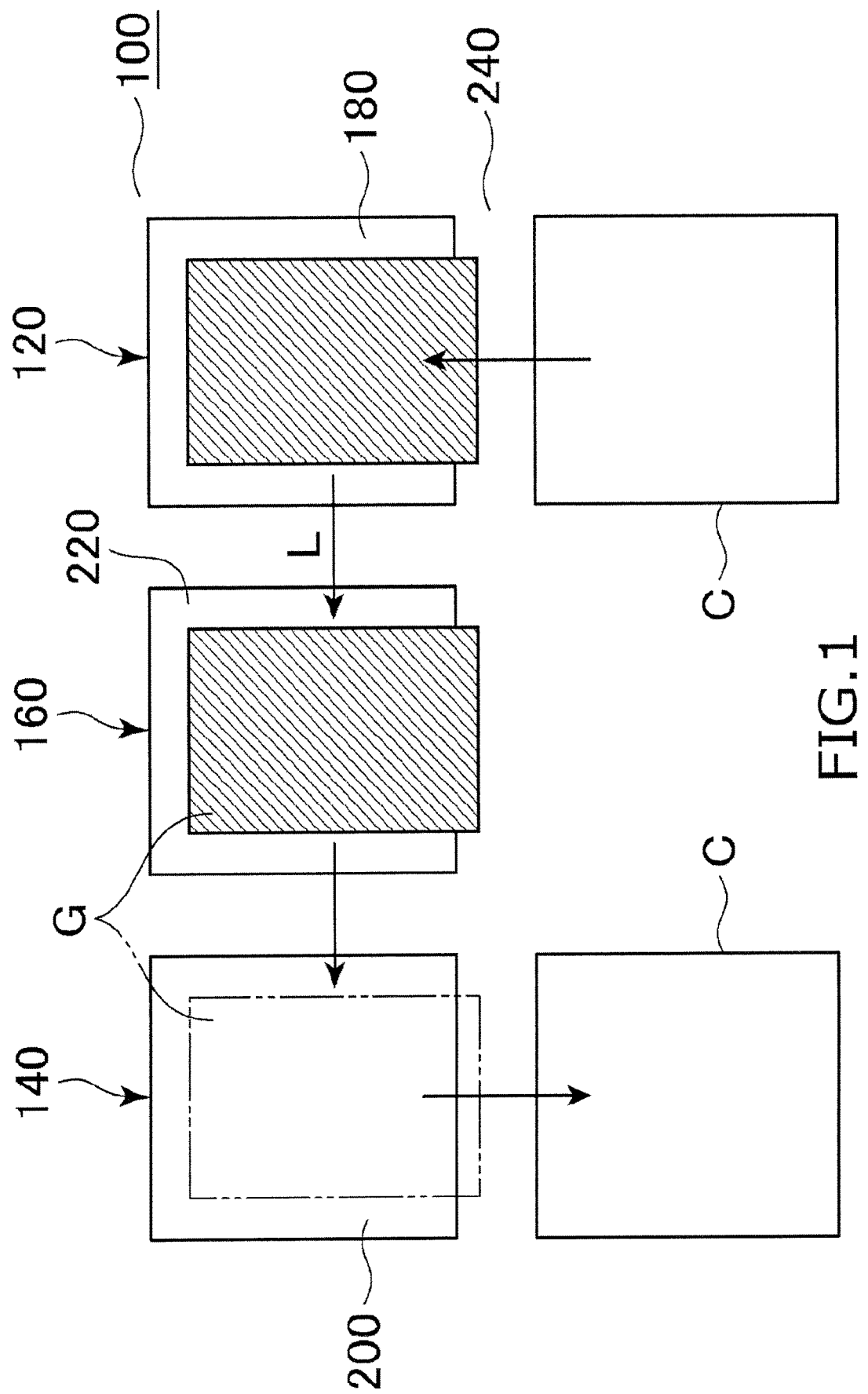
FIG. 1 is a plain view illustrating a layout of a system 100 for conveying and processing substrates according to the first embodiment of the present invention.
Figure 2:
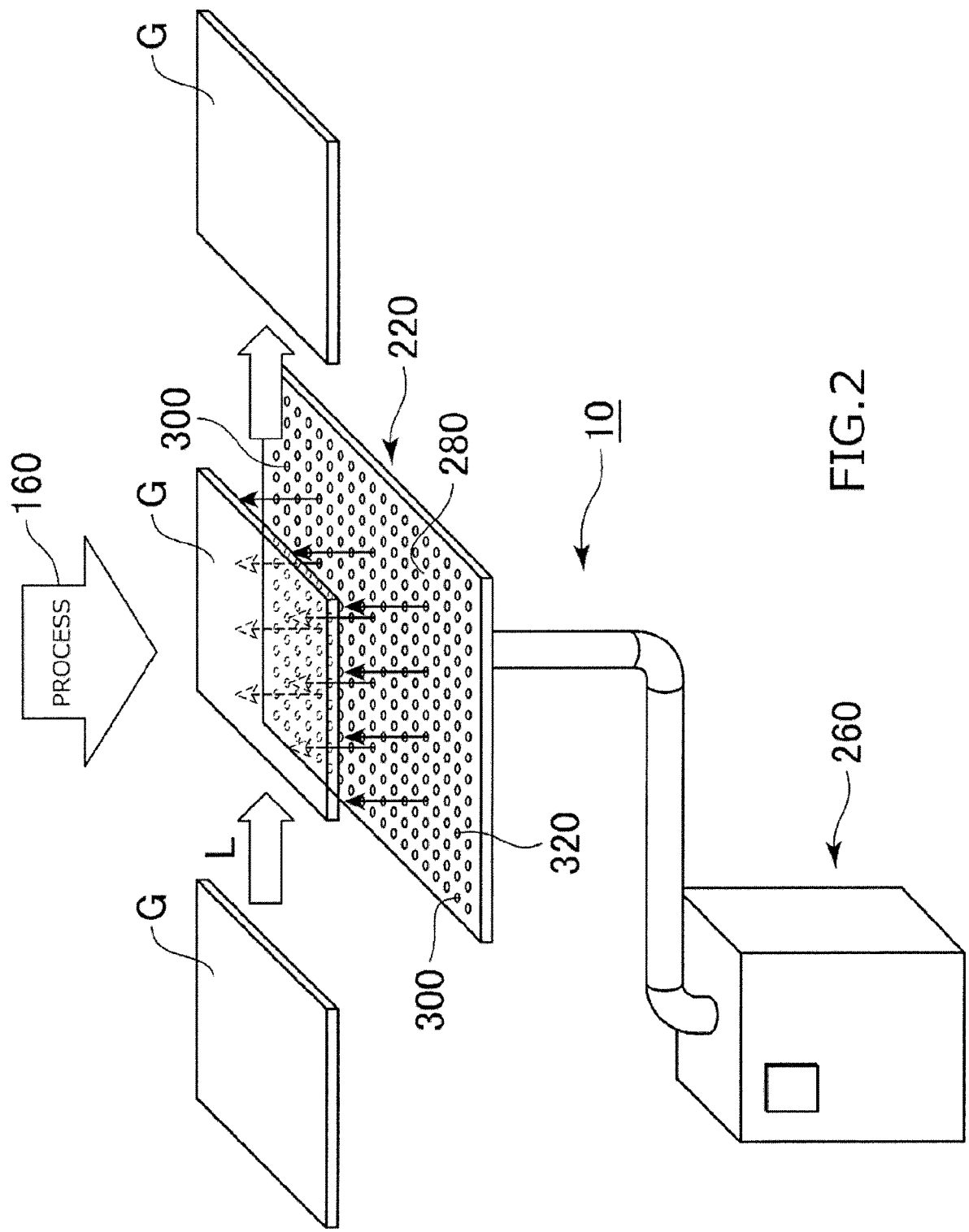
FIG. 2 is a general perspective view illustrating a floating unit 220 of a process unit 160 in a system 100 for conveying and processing substrates according to the first embodiment of the present invention.
Figure 3:
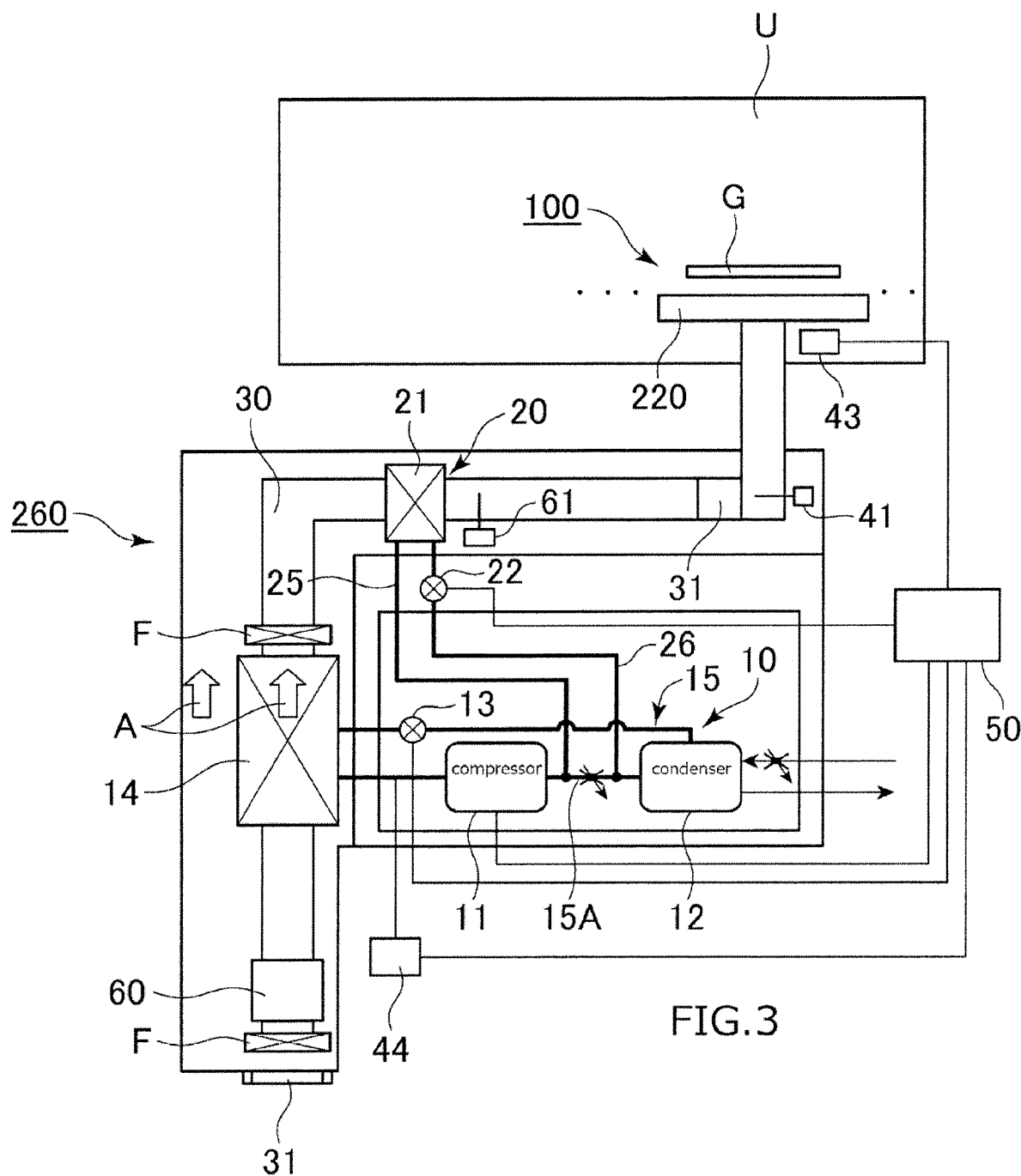
FIG. 3 is a general view illustrating an air conditioner 260 of a process unit 160 in a system 100 for conveying and processing substrates according to the first embodiment of the present invention.
Figure 4:
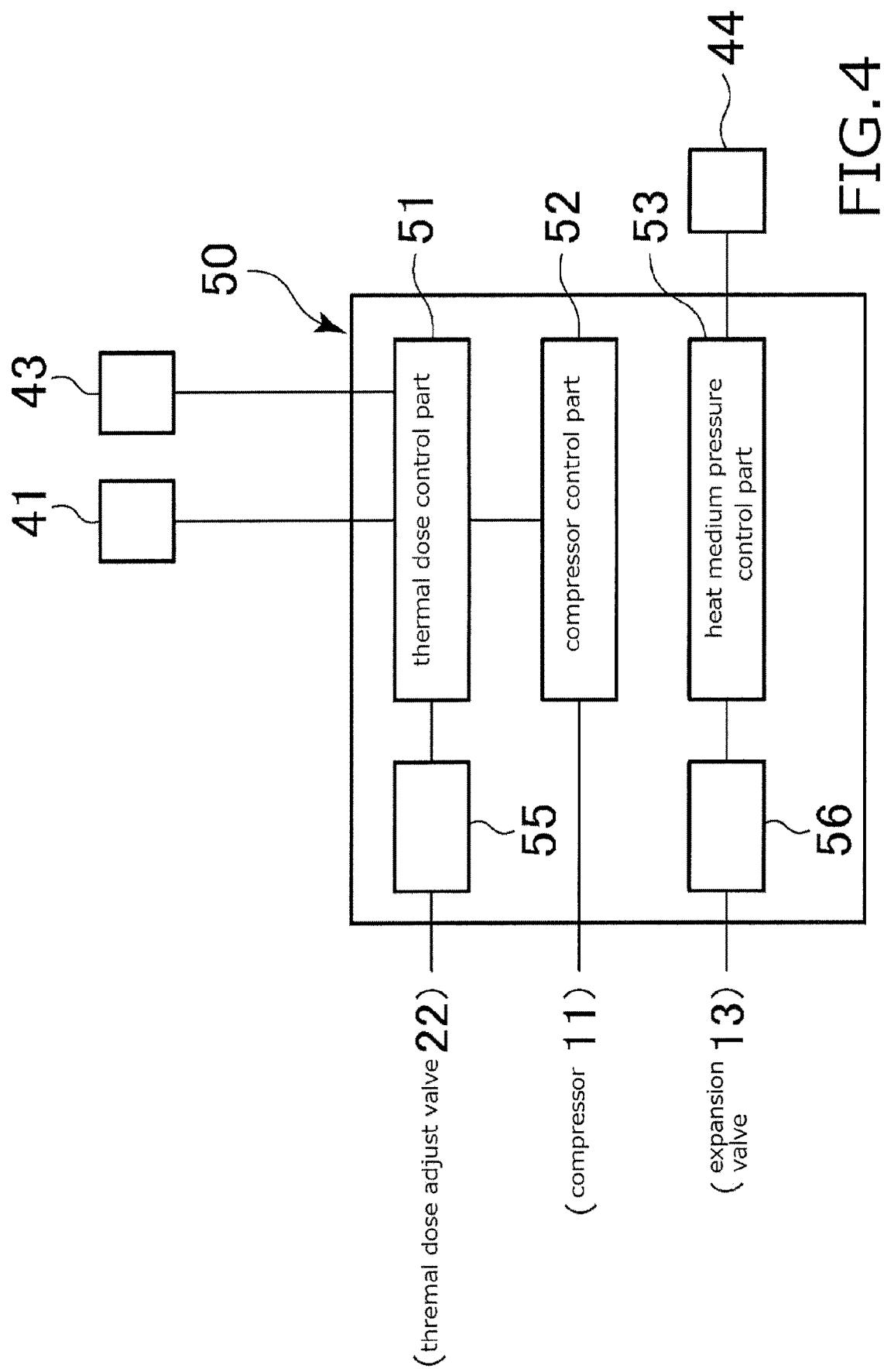
FIG. 4 is a general view illustrating a control part of an air conditioner 260 of a process unit 160 in a system 100 for conveying and processing substrates according to the first embodiment of the present invention.
Figure 5:
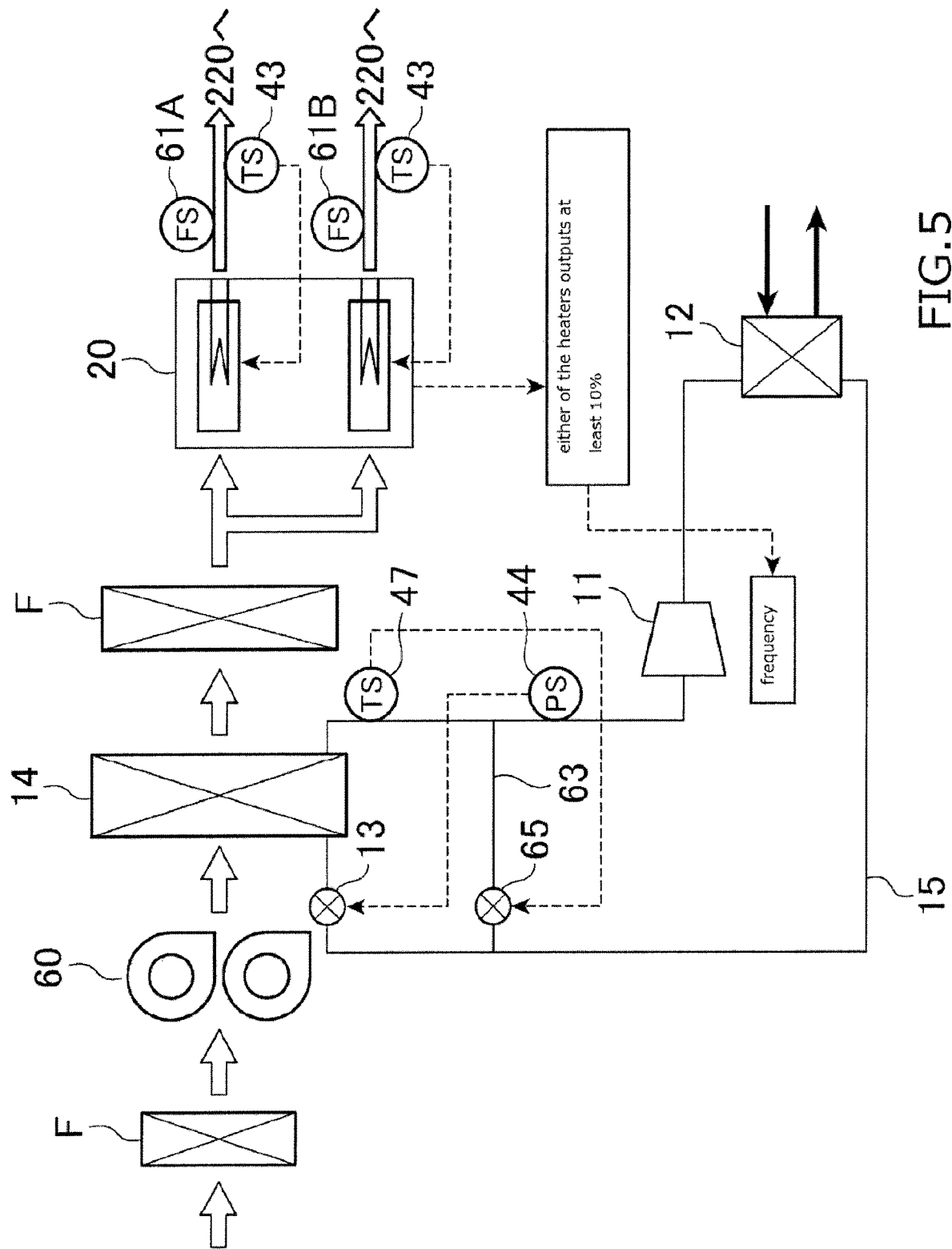
FIG. 5 is a general view similar to FIG. 3 illustrating an air conditioner 260 of a process unit 160 in a system 100 for conveying and processing substrates according to the second embodiment of the present invention.
Figure 6:
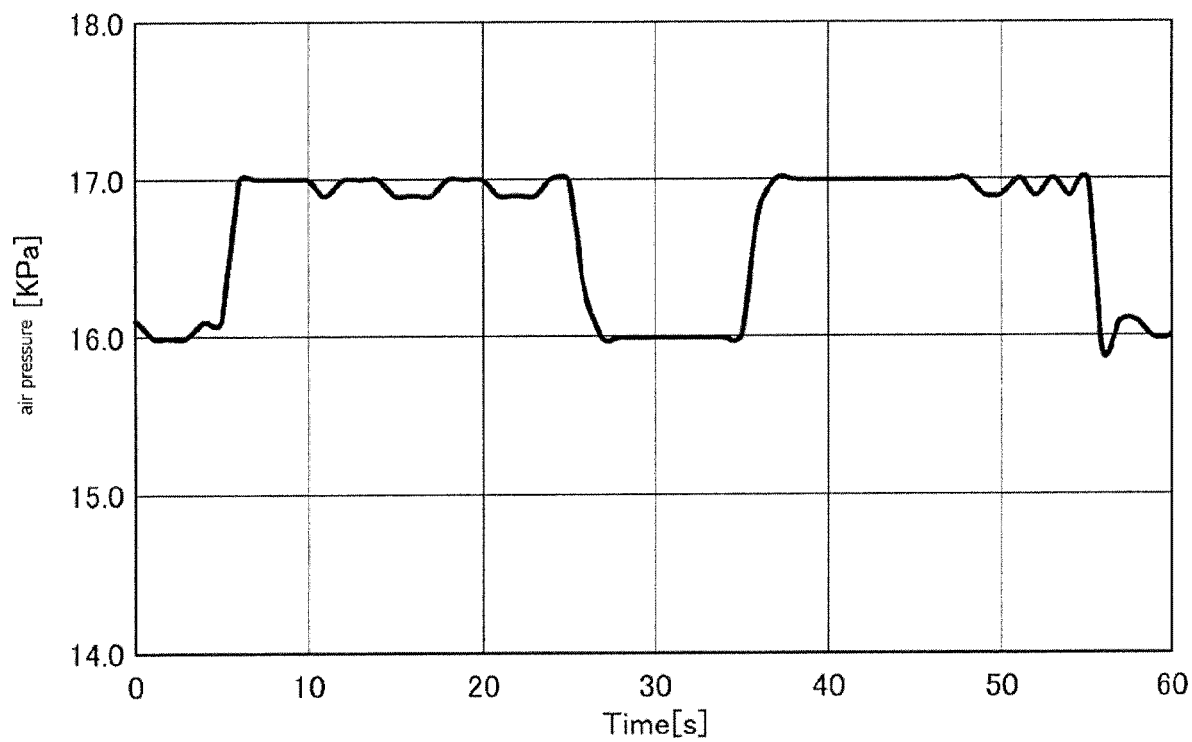
FIG. 6 is a graph showing pressure and temperature variations due to the conveyance of the substrates G in a system 100 for conveying and processing substrates according to the second embodiment of the present invention.
Figure 6:
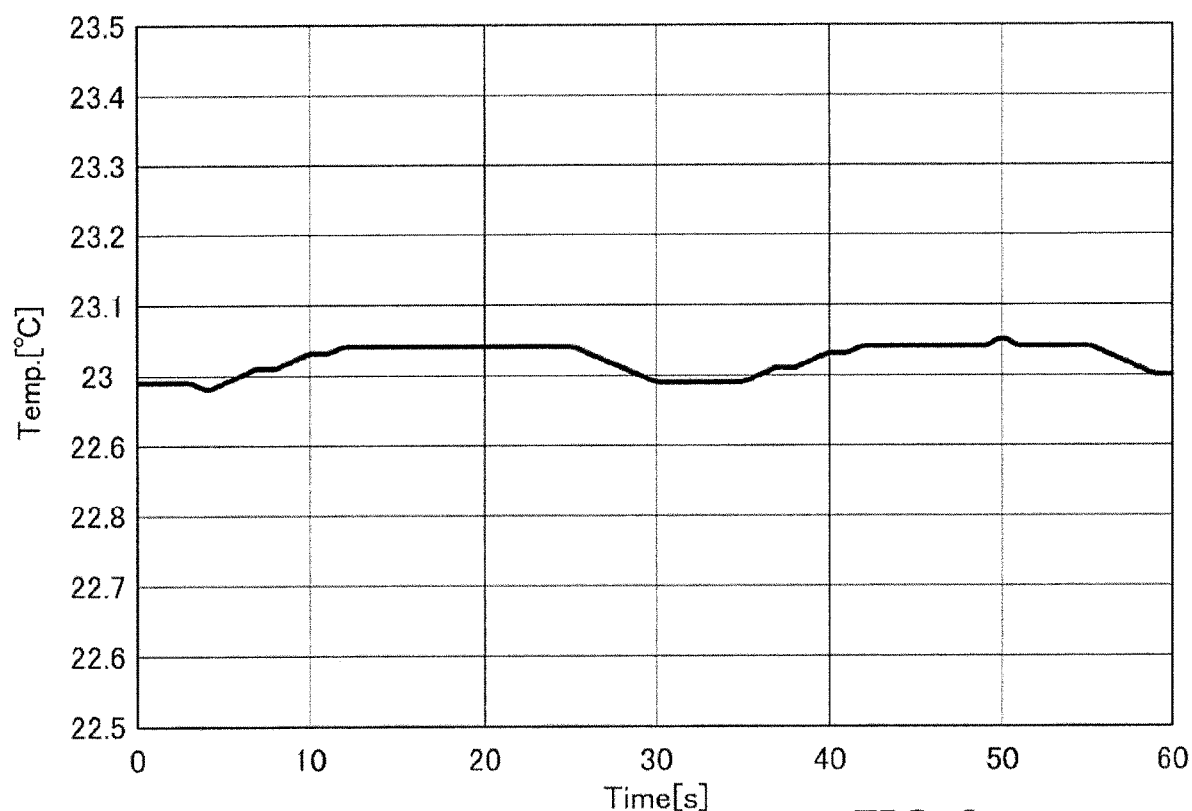

G Substrate
L Substrate conveying line
C Cassette
F Filter
100 System for conveying and processing substrates
120 Loading unit
140 Unloading unit
160 Unit for processing substrate
180 Substrate stage
200 Substrate stage
220 Floating unit
240 Means for conveying substrate 260 Air conditioner
280 floating surface
300 Air injecting opening
320 Air suction opening
10 Cooling unit
11 Compressor
12 Condenser
13 Expansion valve
14 Cooling coil
15 Pipe
15A Pipe
20 Heating unit
21 Heating coil
22 Thermal dose adjusting valve
25 Supply pipe
26 Return pipe
30 Air pipe
31 Inlet
41 First temperature sensor
43 Second temperature sensor
44 Pressure sensor
47 Temperature sensor
50 Control unit
51 Thermal dose control part
52 Compressor control part
53 Heating medium pressure control part
55 First pulse converter
56 Second pulse converter
60 Blower

What is claimed is:

1. An air conditioner, which supplies air, comprising:
a housing,
a blower unit which includes a blower blowing air at a predetermined air amount,
a cooling unit having a cooling coil arranged on a downstream side of the blower unit in an air flowing direction, the cooling unit comprising a compressor which is operated at a variable operating frequency so that a revolving speed thereof is adjustable, a condenser, and said cooling coil are connected in this order by pipes in order to circulate a heating medium to cool blown air,
a heating unit arranged on a downstream side of said cooling coil in the air flowing direction in which the blown air is heated by a heater,
an air pipe, which has a closed cross section inside of which air blown by the blower flows,
a floating unit, which includes air injection openings and functions to float substrates by the air injection openings, such that in the housing, the blower, the cooling unit and the heating unit are directly connected together in this order via the air pipe therebetween, respectively, and the predetermined air amount blown by the blower passes from the blower through the inside of the cooling unit, the inside of the heating unit, the air injection openings of the floating unit and via the inside of the air pipe therebetween,
an air temperature sensor disposed in the housing in a position upstream of the air injection openings where a temperature of air, which is jetted upwardly from the air injection openings toward an underside of the substrate, can be detected, and
a control unit which controls the operating frequency of the compressor, wherein
the cooling unit and the heating unit are controlled in response to a variation of a temperature of air taken in by the blower unit, and/or a target temperature of the substrate, without the air amount of air used for conveying substrates in a floating manner by the blower being adjusted,
said control unit includes a compressor control part which adjusts the revolving speed of the compressor in such a way that the operating frequency of the compressor is decreased by a predetermined frequency when an output of the heating unit exceeds a first threshold value, and the operating frequency of the compressor is increased by the predetermined frequency when the output of the heating unit falls below the first threshold value, and
a part of the air pipe, which extends from an air inlet of the blower, extends to the position where the air temperature sensor is disposed upstream of the air injection openings in the housing.

2. The air conditioner according to claim 1, wherein the compressor control part adjusts the revolving speed of the compressor in such a way that the operating frequency of the compressor is decreased by the predetermined frequency when the output of the heating unit exceeds the first threshold value, and the operating frequency of the compressor is increased by the predetermined frequency when the output of the heating unit falls below a second threshold value, which is smaller than the first threshold value.

3. The air conditioner according to claim 1, wherein air supplied by the air conditioner is used for conveying a substrate in a floating manner,
on a tip end of the air pipe an air injecting opening is provided so as to be upwardly oriented,
the air pipe extends from the air inlet of the blower to the air injecting opening on an intermediate portion of the air pipe, with the cooling unit and the heating unit provided in this order between the blower and the air temperature sensor, and a metal pipe portion is provided near the air temperature sensor on a downstream side of the heating unit,
the metal pipe portion includes material and/or a length and/or a thickness so as to attain a predetermined heat capacity sufficient for alleviating the temperature variations around the substrate caused by the pressure variations which occurs when the substrate is conveyed to pass over the air injecting opening, and
the metal pipe portion is disposed immediately upstream of the position of the air pipe where the air temperature sensor is disposed.

4. The air conditioner according to claim 3, wherein the air pipe is provided so as to communicate the blower with the air injecting opening.

5. The air conditioner according to claim 4, wherein the air pipe is selected from material including a predetermined thermal conductivity.

6. The air conditioner according to claim 4, wherein the air pipe is made of stainless steel.

7. The air conditioner according to claim 1, wherein the cooling unit further comprises an expansion valve between the condenser and the cooling coil and a pressure sensor which detects a pressure inside the pipe on the downstream side of the cooling coil,
the control unit further includes a heating medium pressure control part which controls an opening of the expansion valve,
the heating medium pressure control part calculates, by means of a PID calculation based on a difference between a pressure detected by the pressure sensor and a preset target pressure, an opening manipulated variable of the expansion valve for conforming the pressure detected by the pressure sensor to the target pressure, and controls the opening of the expansion valve in accordance with the opening manipulated variable.

8. An air conditioner, which supplies air, comprising:
a housing,
a blower unit which includes a blower blowing air at a predetermined air amount,
a cooling unit having a cooling coil arranged on a downstream side of the blower unit in an air flowing direction, the cooling unit comprising a compressor which is operated at a variable operating frequency so that a revolving speed thereof is adjustable, a condenser, and the cooling coil are connected in this order by pipes in order to circulate a heating medium to cool blown air,
a heating unit in which a blown air is heated by a heating coil in such a way that a part of the heating medium flowing out from the compressor toward the condenser is caused to diverge to return to flow into the condenser at a downstream side of the compressor through the heating coil and a thermal dose adjusting valve arranged on a downstream side of the heating coil,
an air pipe, which has a closed cross section inside of which air blown by the blower flows,
a floating unit, which includes air injection openings and functions to float substrates by the air injection openings, such that in the housing, the blower, the cooling unit and the heating unit are directly connected together in this order via the air pipe therebetween, respectively, and the predetermined air amount blown by the blower passes from the blower through the inside of the cooling unit, the inside of the heating unit, the air injection openings of the floating unit and via the inside of the air pipe therebetween,
an air temperature sensor which is arranged on an injecting opening through which air having passed through the cooling coil and the heating unit is jetted, with the air temperature sensor disposed in the housing in a position upstream of the air injection openings where a temperature of the air, which is jetted upwardly from the air injection openings toward an underside of the substrate, can be detected, and
a control unit which controls the operating frequency of the compressor and the opening of the thermal dose adjusting valve, wherein
the cooling unit and the heating unit are controlled in response to a variation of a temperature of air taken in by the blower unit, and/or a target temperature of the substrate, without the air amount of air used for conveying substrates in a floating manner by the blower being adjusted,
the control unit includes a thermal dose control part which sets a target source temperature of the air whose temperature is to be controlled, and, by means of a PID calculation based on a difference between a temperature detected by the air temperature sensor and the target source temperature, calculates an opening manipulated variable of the thermal dose adjusting valve for conforming the temperature detected by the air temperature sensor to the target source temperature; and controls the opening of the thermal dose adjusting valve in accordance with the opening manipulated variable; and a compressor control part which adjusts the revolving speed of the compressor in such a way that the operating frequency of the compressor is decreased by a predetermined frequency when the opening manipulated variable of the thermal dose adjusting valve, which is calculated by the thermal dose control part, exceeds a first threshold value over a first predetermined period time, and the operating frequency of the compressor is increased by the predetermined frequency when the opening manipulated variable of the thermal dose adjusting valve, which is calculated by the thermal dose control part, falls below the first threshold value over the first predetermined period time, and
a part of the air pipe, which extends from an air inlet of the blower, extends to the position where the air temperature sensor is disposed upstream of the air injection openings in the housing.

9. The air conditioner according to claim 8, wherein
the compressor control unit which adjusts the revolving speed of the compressor in such a way that the operating frequency of the compressor is decreased by the predetermined frequency when the opening manipulated variable of the thermal dose adjusting valve exceeds the first threshold value over the first predetermined period of time and the operating frequency of the compressor is increased by the predetermined frequency when the opening manipulated variable of the thermal dose adjusting valve falls below a second threshold value, which is smaller than the first threshold value, over the first predetermined period of time.

10. The air conditioner according to claim 9, wherein
the thermal dose control part calculates, as the opening manipulated variable of the thermal dose adjusting valve, an average value of the manipulated variable calculation values of the thermal dose adjusting valve, which are calculated by means of the PID calculation based on the difference between the temperature detected by the air temperature sensor and the target source temperature, over a second predetermined period of time which is set, in accordance with the first predetermined period of time.

11. The air conditioner according to claim 10, wherein the first predetermined time period is set between 10 seconds and 30 seconds.

12. The air conditioner according to claim 11, wherein the second predetermined time period is set in a range of from $1/10$ to $6/10$ of the first predetermined period of time.

13. An unit for floating conveying substrates, comprising
a plurality of floating units for conveying substrate arranged along a direction in which the substrates are conveyed, each of which includes on its upper surface an air injecting opening through which air is jetted upwardly, and
the air conditioner according to claim 10 supplies air toward the corresponding air injecting opening so as to communicate with the plurality of floating units.

14. A method of conveying substrates in a floating manner wherein the substrates are conveyed in a floated manner by jetting air from below toward an underside of the substrate through an air pipe extending up to an injecting opening comprising:
a step of setting an air amount at which air is jetted from the air injecting opening and arranging a metal pipe portion immediately upstream of a position of the air pipe where air temperature is measured,
a step of adjusting the air temperature when the air is jetted from the air injecting opening, and
a step of alleviating a temperature variation within a predetermined range caused by the air pressure variation without the air flow rate being adjusted when the conveyed substrate passes over the air injecting opening, by selecting material and/or a length and/or a thickness of the metal pipe portion so as to attain a predetermined heat capacity.

15. The method of conveying substrates in a floating manner according to claim 14, further comprising:
a step of blowing air toward the air injecting opening in the air passage path, which is an air pipe, provided so as to communicate the blower with the air injecting opening.

16. The method of conveying substrates in a floating manner according to claim 14, wherein
the step of adjusting air temperature includes a step of setting a target source temperature of air whose temperature is to be controlled to effect a PID calculation, based on a difference between the detected air temperature and the target source temperature.

17. The method of conveying substrates in a floating manner according to claim 14, wherein
the step of adjusting air temperature includes a step of cooling air through a latent heat exchange between the heating medium and the air, while, of heating air through a sensible heat exchange so as to adjust the step of cooling air, in accordance with the step of heating air.

\* \* \* \* \*